(12) United States Patent
Shaheen et al.

(10) Patent No.: US 7,148,122 B2
(45) Date of Patent: Dec. 12, 2006

(54) BONDING OF SUBSTRATES

(75) Inventors: Mohamad A. Shaheen, Portland, OR (US); Ryan Z. Lei, Hillsboro, OR (US); Maxim B. Kelman, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 164 days.

(21) Appl. No.: 10/925,503

(22) Filed: Aug. 24, 2004

(65) Prior Publication Data

US 2006/0043483 A1  Mar. 2, 2006

(51) Int. Cl.
*H01L 21/30* (2006.01)

(52) U.S. Cl. .................. 438/455; 438/795; 438/798

(58) Field of Classification Search .............. 438/455
See application file for complete search history.

(56) References Cited

U.S. PATENT DOCUMENTS

| | | | |
|---|---|---|---|
| 4,868,992 A | 9/1989 | Crafts | |
| 4,980,019 A | 12/1990 | Baerg | |
| 6,180,496 B1 * | 1/2001 | Farrens et al. | 438/455 |
| 6,563,133 B1 | 5/2003 | Tong | |
| 6,645,828 B1 | 11/2003 | Farrens | |
| 6,699,798 B1 | 3/2004 | Rockford | |
| 2004/0121556 A1 * | 6/2004 | Kim et al. | 438/455 |
| 2004/0201023 A1 * | 10/2004 | Yamazaki et al. | 257/75 |

* cited by examiner

*Primary Examiner*—Carl Whitehead, Jr.
*Assistant Examiner*—Colleen E. Rodgers
(74) *Attorney, Agent, or Firm*—Schwabe, Williamson & Wyatt, P.C.

(57) ABSTRACT

In one embodiment, a method comprises placing a first and a second substrate into a reaction chamber, the first substrate being made of an indium antimonide material and having a first surface and the second substrate being made of a silicon or a silicon dioxide material and having a second surface; exposing the first and second surfaces to an oxygen plasma; forming a bond between the first and the second substrates by placing the first surface in contact with the second surface; and annealing the first and the second substrates to strengthen the bond.

9 Claims, 4 Drawing Sheets

BONDING OF SUBSTRATES

BACKGROUND OF THE INVENTION

1. Field of the Invention

The present invention relates to semiconductor structures, and in particular, to bonded semiconductor structures.

2. Description of Related Art

In the prior art, bonding two different semiconductor wafers together, with one of the materials being a semiconductor compound III–V material (such as a gallium arsenide (GaAs) wafer to a silicon wafer), has been accomplished by intermediate "glue" layers, such as spin-on glass or wax. Bonding of these wafers requires an elevated temperature, resulting in large stresses in between wafers upon return to room temperature due to a mismatch in the coefficient of thermal expansion. These stresses often result in the bonded pair of wafers breaking or delaminating at room temperature.

In a prior art plasma bonding device, which is essentially a reactive ion etcher device, a plasma has been used for surface activation, i.e., activation of a semiconductor surface to be amenable to bonding. This direct wafer bonding using plasma surface activation is an alternative to using bonding agents (e.g., glue layer) for bonding silicon and other semiconductor materials. With respect to semiconductor compound III–V materials, such plasma bonding to silicon has been claimed for indium phosphide (InP) and gallium arsenide (GaAs) when a hydrogen, argon with hydrogen or H/He plasma is used.

The plasma may be created in a low-pressure gas by inducing an electron flow that ionizes individual gas molecules through electron-gas molecule collisions. Typically, electrons are accelerated in an electric field between two plate electrodes coupled to a radio frequency (RF) power source. The plasma is generated adjacent to the substrate wafer(s), with the wafers typically being co-planar with the electrode plates and supported by a substrate support member within the bonding chamber. The chemical species in the plasma are determined by the source gas or gases used, which include oxygen. Plasma surface activation increases the kinetics of the oxide reaction due to increased mobility of the ionic species created on the surfaces.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

In one embodiment and method according to the present invention, an indium antimonide (InSb) substrate is directly bond to a silicon (Si) substrate or a silicon dioxide ($SiO_2$) substrate at room temperature after an oxygen plasma surface activation in a reaction chamber. One of many possible plasma surface activation devices that may be used to achieve this direct bonding is first described, followed by a description of the direct bonding process using this plasma surface activation device according to one method of the present invention.

Figure 1:
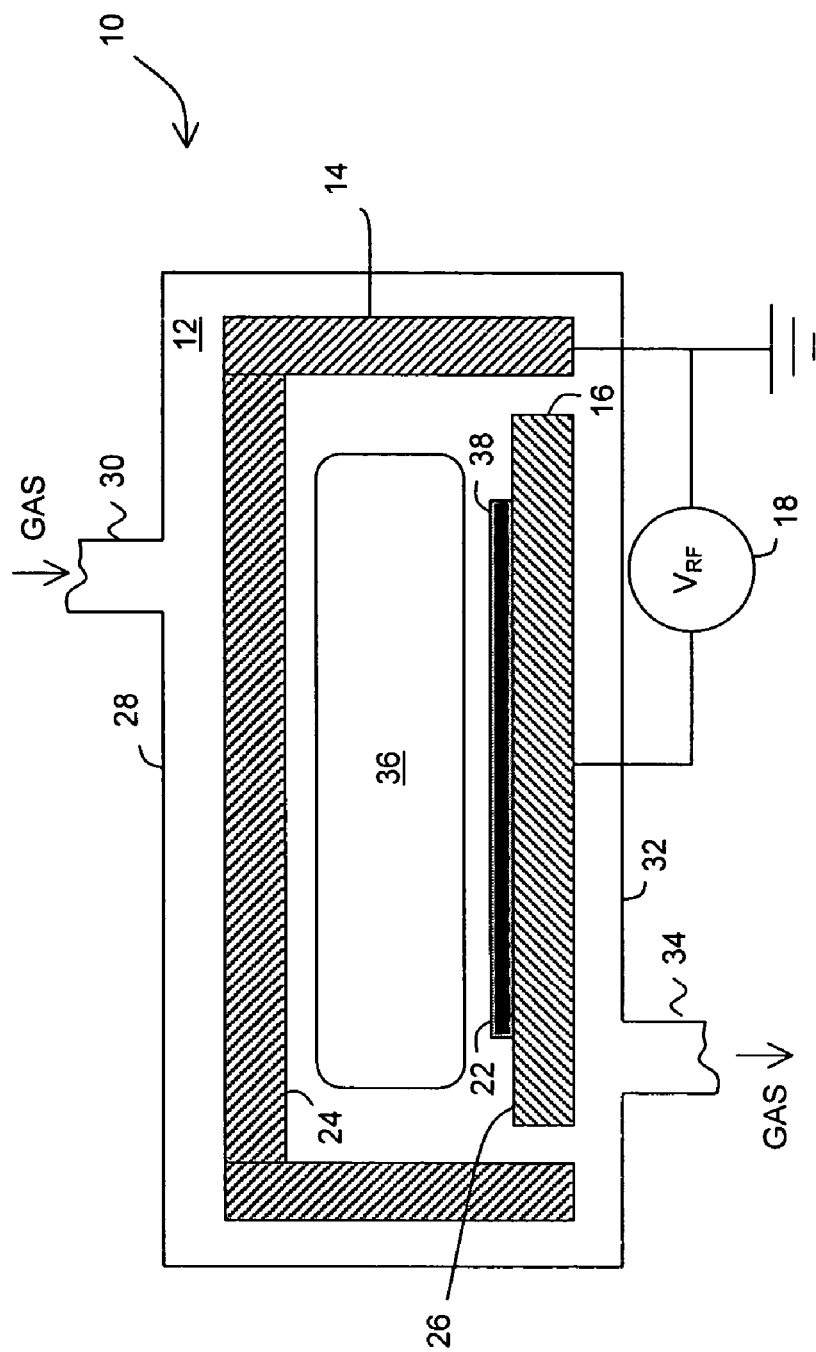
FIG. 1 is a diagram of a plasma surface activation device used to practice the direct bonding process according to one method of the present invention.
Figure 2:
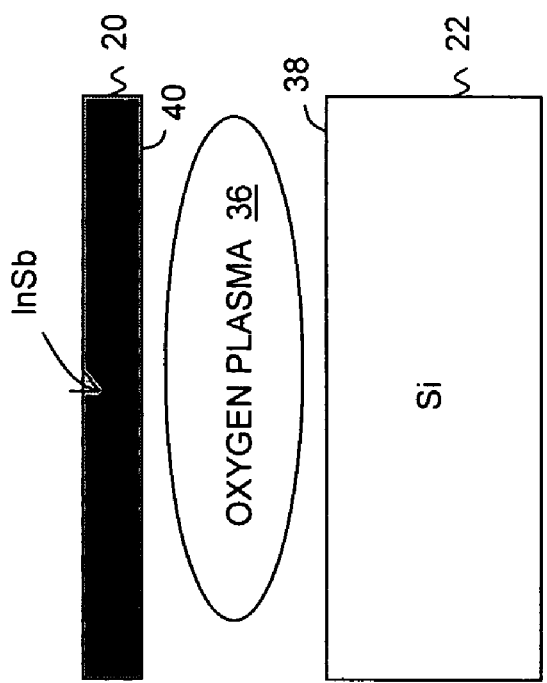
FIG. 2 is a diagram illustrating two substrates prior to bonding undertaking a surface activation phase of the direct bonding process according to one method of the present invention.

Referring to FIGS. 1 and 2, a plasma surface activation device 10 is illustrated. The plasma surface activation device 10 may have a reaction chamber 12 with an upper first electrode 14 and a lower second electrode 16 initially spaced at a predetermined distance from one another. Although the first electrode 14 is shown as having a U-shaped configuration, such as used in a reactive-ion etcher, the first electrode 14 may be planar, like second electrode 16, as used in a plasma etcher. A radio frequency (RF) voltage may be applied by a RF power source 18 (i.e., RF oscillator) to the second electrode 16 and the first electrode 14 may be grounded. In one embodiment, the electrode 16 also may act as a substrate holder for an indium antimonide (InSb) wafer 20 (i.e., substrate) and a silicon (Si) wafer 22 (i.e., substrate). In another embodiment, a silicon dioxide ($SiO_2$) substrate may be used in place of the silicon wafer shown in the FIGS. In one embodiment, the electrode 16 may hold the wafers 20 and 22 one at a time. In another embodiment, a separate wafer holding mechanism may be used. Opposed surfaces 24 and 26 of the first and second electrodes 14 and 16 may be substantially parallel. A top wall 28 of the chamber 12 may have a gas introduction pipe 30 coupled to a gas source (not shown). A bottom wall 32 of the chamber 12 may have an exhaust pipe 34 coupled to an exhaust device (not shown), such as a turbo-molecular pump to provide the necessary degree of vacuum, i.e., the desired low pressure. Cooling water (not shown) may maintain the second electrode 16 at a regulated temperature. By a mechanical mechanism (not shown), the second electrode 16 may be raised or lowered relative to the first electrode 14. Although a particular surface activation device 10 is described above, it should be appreciated that the surface activation device 10 is provided for illustrative purposes only and that a variety of prior art plasma etching or reactive ion etching equipment may be used.

A process or reactive gas, in the form of oxygen, may be introduced into the chamber 12 through the pipe 30 into a space between the electrodes 14 end 16. In this region, the RF excitation may ionize the oxygen gas in a reduced pressure environment to convert the oxygen gas into a plasma 36 having free radicals. These free radicals may engage a surface 40 of the InSb substrate 20 and a surface 38 of the Si or $SiO_2$ substrate 22 to achieve surface activations on both surfaces. In one embodiment, the substrates 20 and 22 are placed into the surface activation device 10 one at a time. FIG. 2 illustrates that bath surfaces 38 and 40 are subjected to surface activation; however, this is undertaken by having only one substrate in the reaction chamber 12 and on the electrode 16 at a time. This surface activation may include introducing surface damage that creates thin amorphized layers (not shown), i.e., non-crystalline structure, an the surfaces 38 and 40. During this process, the chamber 12 may be exhausted through the exhaust pipe 34 to maintain a predetermined low pressure level.

The plasma surface activation device 10 may have the following settings in one embodiment according to the present invention: an initial gap between electrodes 14 and 16 may be selected from a range of 1 to 50 millimeters; a chamber pressure may be selected from a range of 5 to 500 milliTorr; an inert gas flow may be selected from a range of 5 to 50 standard cubic centimeters per minute (sccm). The surface activation device 10 may be driven by the RF oscillator 18 to cause the second electrode 16 to build up to a potential of approximately −5 to −25 Volts. A DC bias voltage of 0 to −20 Volts may build up on the second electrode 16 during operation.

Figure 3:
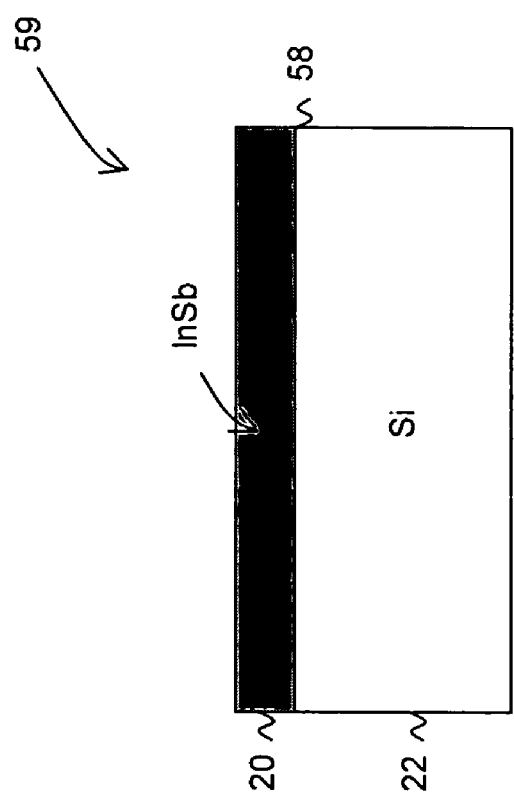
FIG. 3 is a diagram illustrating a bonded structure, according to one embodiment of the present invention, formed from the two substrates after direct bonding during another phase of the direct bonding process, according to one method of the present invention.
Figure 4:
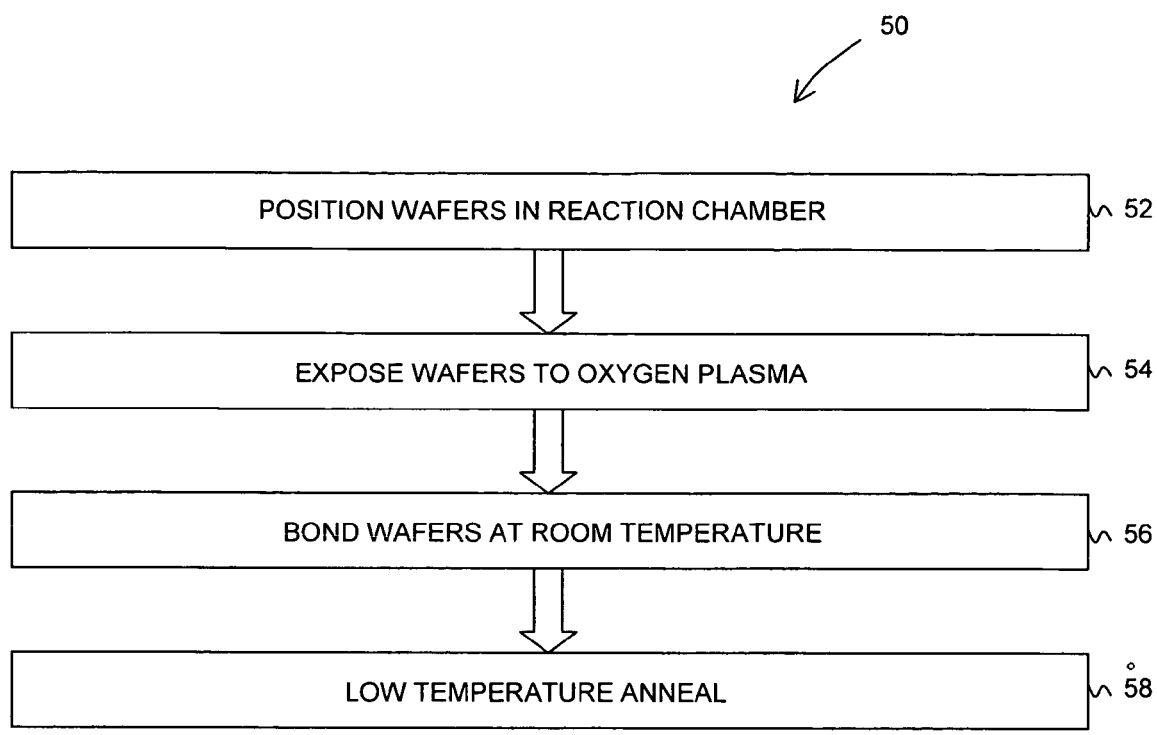
FIG. 4 is a flow chart of the direct bonding process according to one method of the present invention.

Referring to FIGS. 1 through 4, with respect to the direct bonding process according to one method of the present invention, the following phases may be undertaken as illustrated by a flow chart 50 in FIG. 4. Prior to starting the bonding process, the InSb substrate 20 and the Si or $SiO_2$ substrate 22 shown in FIG. 2 may be cleaned. At a phase 52 of FIG. 4, the substrates 20 and 22 may be positioned in the reaction chamber one at a time (as shown in FIG. 1). At a phase 54 of FIG. 4, the substrates 20 and 22 (as shown in FIG. 2) may be exposed to the oxygen plasma for 5 to 100 seconds to form the amorphized layers on the surfaces 38 and 40 (as shown in FIGS. 1 and 2). The oxygen plasma may also promote the formation of dangling bonds, such as dangling oxygen or silicon bonds, which may further promote the formation of a silicon oxide interface. At a phase 56 of FIG. 4, the InSb substrate 20 and the Si or $SiO_2$ substrate 22 are removed from the reaction chamber and then may be bonded to each other by contact at room temperatures (as shown in FIG. 3). In other words, such bonding is accomplished by bring the two substrates together so that the surfaces 38 and 40 come into contact. The bonds formed during the phase 56 at an interface 58 may be fairly weak. At a phase 58 of FIG. 4, a low temperature anneal of the bonded substrates 20 and 22 may be undertaken in air with a temperature range extending from 200 to 400 degrees centigrade so as to increase the direct bond strength at the interface 58. The anneal phase may be undertaken through conduction using a hot plate or through convection by placing the bonded structure into a chamber of an oven or furnace. In FIG. 3, a final bonded structure 59 is shown.

Room temperature direct bonding of the InSb substrate 20 to Si or $SiO_2$ substrate 22 after surface activation may allow for low temperature bonding of the two substrates, avoiding the previously-described difficulties associated with coefficient of thermal expansion mismatch between the two substrates. Moreover, the bonded structure 59 with no intermediate agent or glue layer may be achieved.

Figure 5:
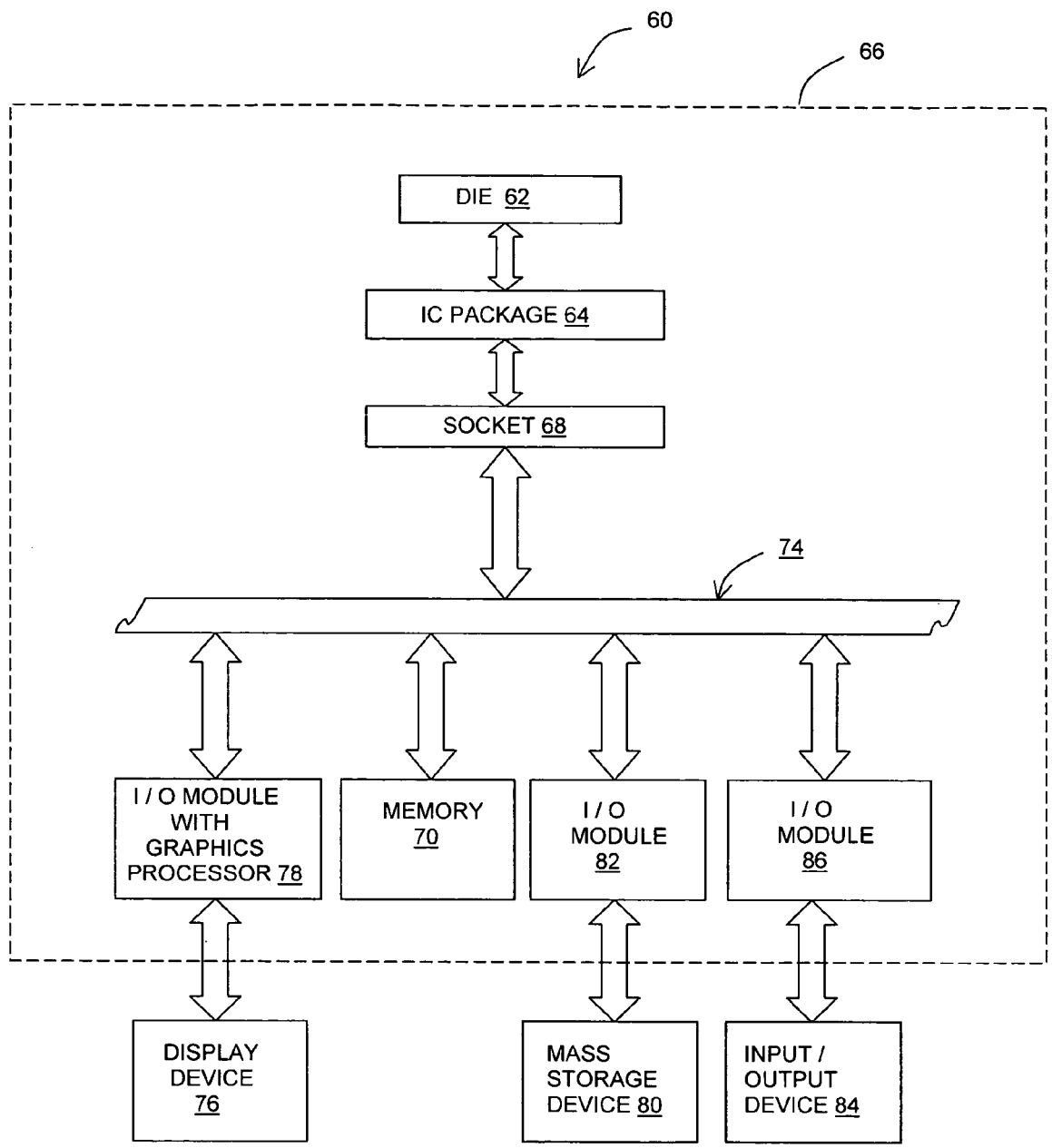
FIG. 5 is a block diagram of a system including an integrated circuit chip incorporating the bonded structure of FIG. 3 according to one embodiment of the present invention.

Referring to FIG. 5, there is illustrated a system 60, which is one of many possible systems in which an integrated circuit (IC) die 62 may include the bonded structure 59 of FIG. 3 in accordance with one embodiment of the present invention. In the system 60, the die 62 is mounted in a semiconductor package 64. The semiconductor package 64 may be mounted on a printed circuit board (PCB) 66 via a socket 68. The IC die 62 of the semiconductor package 64 may be a processor and the PCB 66 may be a motherboard. However, in other systems the semiconductor package 64 may be directly coupled to the PCB 66 (eliminating the socket 68 which allows the semiconductor package 64 to be removable). In addition to the socket 68 and the semiconductor package 64, the PCB 66 may have mounted thereon a main memory 70 and a plurality of other input/output (I/O) modules for external devices or external buses, all coupled to each other by a bus system 74 on the PCB 66. More specifically, the system 60 may include a display device 76 coupled to the bus system 74 by way of an I/O module 78, with the I/O module 78 having a graphical processor and a memory. The I/O module 78 may be mounted on the PCB 66 as shown in FIG. 5 or may be mounted on a separate expansion board. The system 60 may further include a mass storage device 80 coupled to the bus system 74 via an I/O module 82. Another I/O device 84 may be coupled to the bus system 74 via a network interface I/O module 86. Additional I/O modules may be included for other external or peripheral devices or external buses.

Examples of the main memory 70 include, but are not limited to, static random access memory (SRAM) and dynamic random access memory (DRAM). The memory 70 may include an additional cache memory. Examples of the mass storage device 80 include, but are not limited to, a hard disk drive, a compact disk drive (CD), a digital versatile disk driver (DVD), a floppy diskette, a tape system and so forth. Examples of the input/output devices 84 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 66. Examples of the bus system 74 include, but are not limited to, a peripheral control interface (PCI) bus, and Industry Standard Architecture (ISA) bus, and so forth. The bus system 74 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 74. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC die 62 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

In various embodiments, the system 60 may be a wireless mobile or cellular phone, a pager, a portable phone, a one-way or two-way radio, a personal digital assistant, a pocket PC, a tablet PC, a notebook PC, a desktop computer, a set-top box, an entertainment unit, a DVD player, a server, a medical device, an internet appliance and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method, comprising:
   placing a first and a second substrate into a reaction chamber, the first substrate being made of an indium antimonide material and having a first surface and the second substrate being made of a selected one of a silicon and a silicon dioxide material and having a second surface;
   exposing the first and the second surfaces to an oxygen plasma to form a first and a second amorphization layer in the first and the second substrates, respectively;
   forming a bond between the first and the second substrates by placing the first surface in contact with the second surface;
   annealing the first and the second substrates to strengthen the bond; and
   wherein the placing of the first surface in contact with the second surface to form the bond includes maintaining an environment surrounding the first and the second substrates substantially at a room temperature.

2. The method according to claim 1, wherein the annealing of the first and the second substrates includes raising a temperature of the first and second substrates to a value selected from a range of 200 to 400 degrees centigrade.

3. The method according to claim 1, wherein the exposing of the first and the second surfaces to the oxygen plasma includes exposing the first and the second surfaces to the oxygen plasma for an exposure time selected from a range of 5 to 100 seconds.

4. The method according to claim 3, wherein the placing of the first and the second substrate into the reaction chamber includes placing the first and the second substrates into the reaction chamber one at a time.

5. The method according to claim 1, wherein the placing of the first surface in contact with the second surface to form the bond further includes removing the first and the second substrates from the reaction chamber prior to forming the bond.

6. The method according to claim 1, further comprising:
   lowering a pressure in the reaction chamber to a pressure value selected from a range of 5 to 500 milliTorr.

7. The method according to claim 1, wherein the exposing of the first and the second surfaces to the oxygen plasma includes applying a radio frequency voltage from a radio frequency voltage source to a pair of electrodes surrounding one of the first and the second substrates, the radio frequency voltage being selected from a range of −5 to −25 volts.

8. The method according to claim 1, wherein the exposing of the first and the second surfaces to the oxygen plasma further includes setting a distance between the first and second electrodes which is selected from a range of 1 to 50 millimeters.

9. The method according to claim 1, wherein the exposing of the first and the second surfaces to the oxygen plasma includes introducing a flow of oxygen into the reaction chamber at a flow rate selected from a range of 5 to 50 standard cubic centimeters per minute.

* * * * *